United States Patent
Zheng et al.

(10) Patent No.: US 12,054,060 B2
(45) Date of Patent: Aug. 6, 2024

(54) CHARGING CONNECTOR FOR ELECTRIC VEHICLE

(71) Applicant: T-CONN PRECISION (ZHONGSHAN) CO., LTD., Zhongshan (CN)

(72) Inventors: Jia-Heng Zheng, Zhongshan (CN); Wu-Lin Liu, Zhongshan (CN)

(73) Assignee: T-Conn Precision (Zhongshan) Co., Ltd., Guangdong (CN)

( * ) Notice: Subject to any disclaimer, the term of this patent is extended or adjusted under 35 U.S.C. 154(b) by 429 days.

(21) Appl. No.: 17/496,027

(22) Filed: Oct. 7, 2021

(65) Prior Publication Data
US 2023/0054340 A1 Feb. 23, 2023

(30) Foreign Application Priority Data

Aug. 20, 2021 (CN) .......................... 202110963758.5

(51) Int. Cl.
*B60L 53/16* (2019.01)
*H01R 4/60* (2006.01)
*H01R 24/52* (2011.01)
*H05K 7/20* (2006.01)

(52) U.S. Cl.
CPC ................ *B60L 53/16* (2019.02); *H01R 4/60* (2013.01); *H01R 24/52* (2013.01); *H05K 7/20436* (2013.01)

(58) Field of Classification Search
CPC ........... B60L 53/16; H01R 4/60; H01R 24/52; H05K 7/20436

USPC .......................................................... 320/109
See application file for complete search history.

(56) References Cited

U.S. PATENT DOCUMENTS

| 11,070,013 | B2* | 7/2021 | Brandt | H01R 24/542 |
| 2016/0043505 | A1* | 2/2016 | Wu | H01R 13/11 |
| | | | | 439/217 |
| 2021/0288363 | A1* | 9/2021 | Okada | H01G 11/10 |
| 2022/0264737 | A1* | 8/2022 | Fuehrer | H05K 1/0201 |
| 2023/0054340 | A1* | 2/2023 | Zheng | H01R 13/111 |

FOREIGN PATENT DOCUMENTS

| CN | 209133812 U | 7/2019 |
| TW | 701869 B | 8/2020 |

* cited by examiner

*Primary Examiner* — Nathaniel R Pelton
(74) *Attorney, Agent, or Firm* — Rosenberg, Klein & Lee

(57) ABSTRACT

A charging connector for an electrical vehicle has a connector base, a tubular first conductive terminal mounted in the connector base, an insulating isolation member mounted in the first conductive terminal, and a second conductive terminal mounted in a center of the isolation member and coaxially disposed in and electrically isolated from the first conductive terminal. The isolation member has at least one annular groove recessed in an upper surface of the isolation member, extending downwardly, and coaxially surrounding the second conductive terminal. A creepage distance between the first conductive terminal and the second conductive terminal is increased and a surface area for heat dissipation is increased to meet safety specifications.

8 Claims, 13 Drawing Sheets

CHARGING CONNECTOR FOR ELECTRIC VEHICLE

BACKGROUND OF THE INVENTION

1. Field of the Invention

The present invention relates to a charging connector, and more particularly to a charging connector for an electric vehicle that has a specific structure designed to increase creepage distance and electrical clearance.

2. Description of the Related Art

National Standard of People's Republic of China GB 24155-2020 "Safety specifications for electric motorcycles and electric mopeds", defines creepage distance and electrical clearance specifications related to charging interface. The creepage distance related to storage battery should meet specifications as follows:

1. A creepage distance d1 between connection terminals of the storage battery is determined according to formula (1) below, unit of the creepage distance d1 being millimeter:

$$d1 \geq 0.25U + 5 \qquad (1)$$

2. A creepage distance d2 between the live part and charging platform is determined according to formula (2) below, unit of the creepage distance d2 being millimeter:

$$D2 \geq 0.125U + 5 \qquad (2)$$

U defined in aforementioned formulae (1) and (2) is a maximum working voltage between two output terminals of the storage battery, unit of the working voltage being volt.

In addition, an electrical clearance between conductive parts should not be smaller than 2.5 millimeters.

Measurements of the electrical clearance and the creepage distance are as shown in FIG. 8. Two connection terminals 71, 72 are disposed on a carrier 70. Each of the two connection terminals 71, 72 has a conductive surface 710, 720. A distance between the two conductive surfaces 710, 720 is an electrical clearance G. A distance between the two connection terminals 71, 72 measured along a surface of the carrier 70 is a creepage distance D.

Accordingly, the above-mentioned requirements of creepage distance and electrical clearance related to charging interface of electric vehicles are required by People's Republic of China. With reference to FIGS. 9 and 10, a conventional connector for an electric vehicle has a connector base 80, a negative terminal 81 mounted in the connector base 80, and a positive terminal 82 coaxially disposed in and electrically isolated from the negative terminal 81. The negative terminal 81 is tubular and has an upper cavity 811 and a lower cavity 812 formed therein and communicating with each other. An internal diameter of the upper cavity 811 is larger than an internal diameter of the lower cavity 812.

A crown spring 813 is mounted in the upper cavity 811 and is conductively connected with the negative terminal 81. The crown spring 813 has multiple contacting reeds. Each of the contacting reeds is bended toward an axial direction to form a contact point. When the above-mentioned conventional connector is connected with a corresponding connector, the crown spring 813 is the main conductive medium of negative electrode. The contact points of the contacting reeds of the crown spring 813 are conductive surfaces of the negative terminal 81.

To coaxially dispose the positive terminal 82 in the negative terminal 81 and electrically isolate the positive terminal 82 from the negative terminal 81, an isolating holder 83 complementary in shape to the lower cavity 812 is mounted in the lower cavity 812 of the negative terminal 81. The positive terminal 82 is mounted in a center of the isolating holder 83. Whereby, the positive terminal 82 and the negative terminal 81 are electrically isolated from each other via the isolating holder 83. According to the above mentioned safety specifications of the National Standard of People's Republic of China, the working voltage for the conventional connector is 50.4 volts. The creepage distance determined according to the formula (1) must be larger than or equal to 17.6 millimeters (0.25×50.4+5). The electrical clearance must be larger than 2.5 millimeters. That means the creepage distance from the negative terminal 81 along the surface of the isolating holder 83 to the positive terminal 82 must be larger than 17.6 millimeters.

The contact points of the crown spring 813 are conductive surfaces of the negative terminal 81, so the electrical clearance between each of the contact points of the crown 813 and the positive terminal 82 must be larger than 2.5 millimeters. As shown in FIG. 11, after measured, the electrical clearance G1 from each of the contact points of the crown spring 813 in the negative terminal 81 to the positive terminal 82 is 5.375 millimeters, is larger than 2.5 millimeters, and meets the safety specifications. However, the creepage distance D1 from the negative terminal 81 along the surface of the isolating holder 83 to the positive terminal 82 is only 3.8 millimeters, is smaller than 17.6 millimeters, and does not meet the safety specifications.

In addition, a creepage distance related to external connection of the conventional connector does not meet the safety specifications. With reference to FIGS. 12 and 13, each of the negative terminal 81 and the positive terminal 82 is connected with a respective electrical connecting sheet 84, 85. The two electrical connecting sheets 84, 85 each have one respective end, the two ends respectively fixed on bottoms of the negative terminal 81 and the positive terminal 82, and the other ends of the two electrical connecting sheets 84, 85 are bended to extend out from the bottom of the connector base 80 for external electrical connection. According to the specifications of the connector, the two electrical connecting sheets 84, 85 are adjacent to each other at the bottom of the connector base 80. A minimum distance D2 between the two electrical connecting sheets 84, 85 is 6.20 millimeters, and meets the electrical clearance requirement, which must be larger than 2.5 millimeters. However, it is smaller than the required creepage distance, i.e., at least 17.6 millimeters.

Accordingly, the conventional connector for the electrical vehicle cannot meet the safety specifications for the creepage distance. A solution for this issue is needed.

SUMMARY OF THE INVENTION

The main purpose of the present invention is to provide a charging connector for an electric vehicle that has special terminals and insulation structures to increase creepage distance and electrical clearance to meet the safety specifications.

To achieve the foregoing purpose, the charging connector for the electric vehicle in accordance with the present invention comprises a connector base, a first conductive terminal, an isolation member, and a second conductive terminal. The first conductive terminal is mounted in the connector base via one of two ends of the first conductive terminal, extends out from the connector base via the other one of the two ends of the first conductive terminal is tubular, and has an upper cavity and a lower cavity formed in the first conductive terminal. The lower cavity has a recessed surface radially recessed in a cavity surface of the lower cavity to increase an internal diameter of the lower cavity.

The isolation member complementary in shape to the lower cavity is mounted in the lower cavity and has at least one annular groove coaxially recessed in an upper surface of the isolation member and extending downwardly. The second conductive terminal is mounted in a center of the isolation member and coaxially disposed in and electrically isolated from the first conductive terminal. One of two ends of the second conductive terminal extends into the upper cavity of the first conductive terminal and the other one of the two ends of the second conductive terminal extends out from a bottom of the isolation member.

Other objectives, advantages and novel features of the invention will become more apparent from the following detailed description when taken in conjunction with the accompanying drawings.

DETAILED DESCRIPTION OF THE INVENTION

Figure 1:
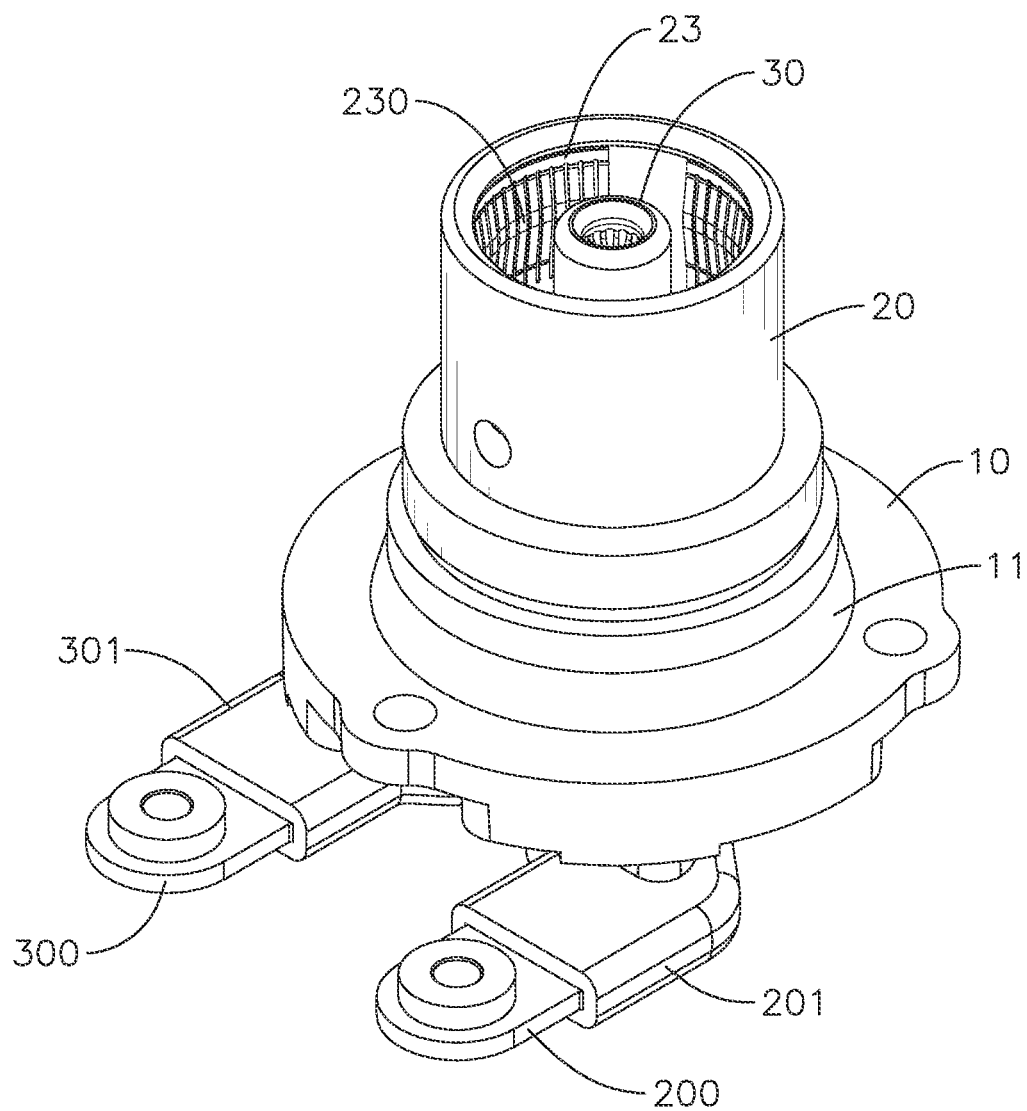
FIG. 1 is a perspective view of a charging connector for an electric vehicle in accordance with the present invention.
Figure 2:
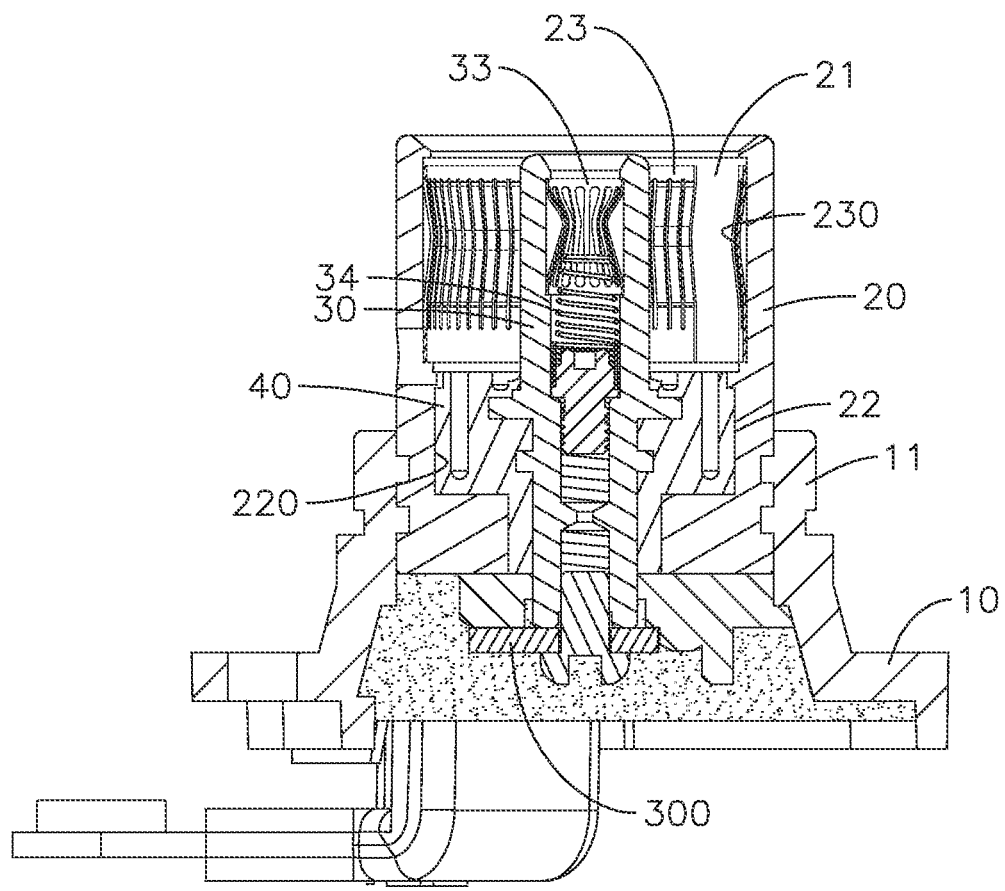
FIG. 2 is a cross sectional side view of the charging connector for the electric vehicle in FIG. 1.

With reference to FIGS. 1 and 2, an embodiment of a charging connector for an electric vehicle in accordance with the present invention comprises a connector base 10, a first conductive terminal 20 disposed in the connector base 10, and a second conductive terminal 30 coaxially disposed in and electrically isolated from the first conductive terminal 20. The first conductive terminal 20 may be a negative conductive terminal or a positive conductive terminal. The second conductive terminal 30 may be a positive conductive terminal or a negative conductive terminal depending on the first conductive terminal 20. In the embodiment, the first conductive terminal 20 is a negative conductive terminal and the second conductive terminal 30 is a positive conductive terminal. The first and the second conductive terminals 20, 30 working as negative and positive conductive terminals respectively are only an exemplary configuration, not limited thereto.

The connector base 10 is hollow and tubular and has an annular boss 11 formed on a top thereof. The first conductive terminal 20 is complementary in shape to the boss 11 and is mounted in the boss 11.

The first conductive terminal 20 is hollow and tubular. The first conductive terminal 20 is mounted in the boss 11 of the connector base 10 via one of two ends thereof and extends out from the boss 11 via the other one of the two ends thereof. The first conductive terminal 20 has an upper cavity 21 and a lower cavity 22 communicating with each other. An internal diameter of the upper cavity 21 is larger than an internal diameter of the lower cavity 22. The lower cavity 22 further has a recessed surface 220 radially recessed in a cavity surface of the lower cavity 22 to further increase the internal diameter of the lower cavity 22.

Figure 3:
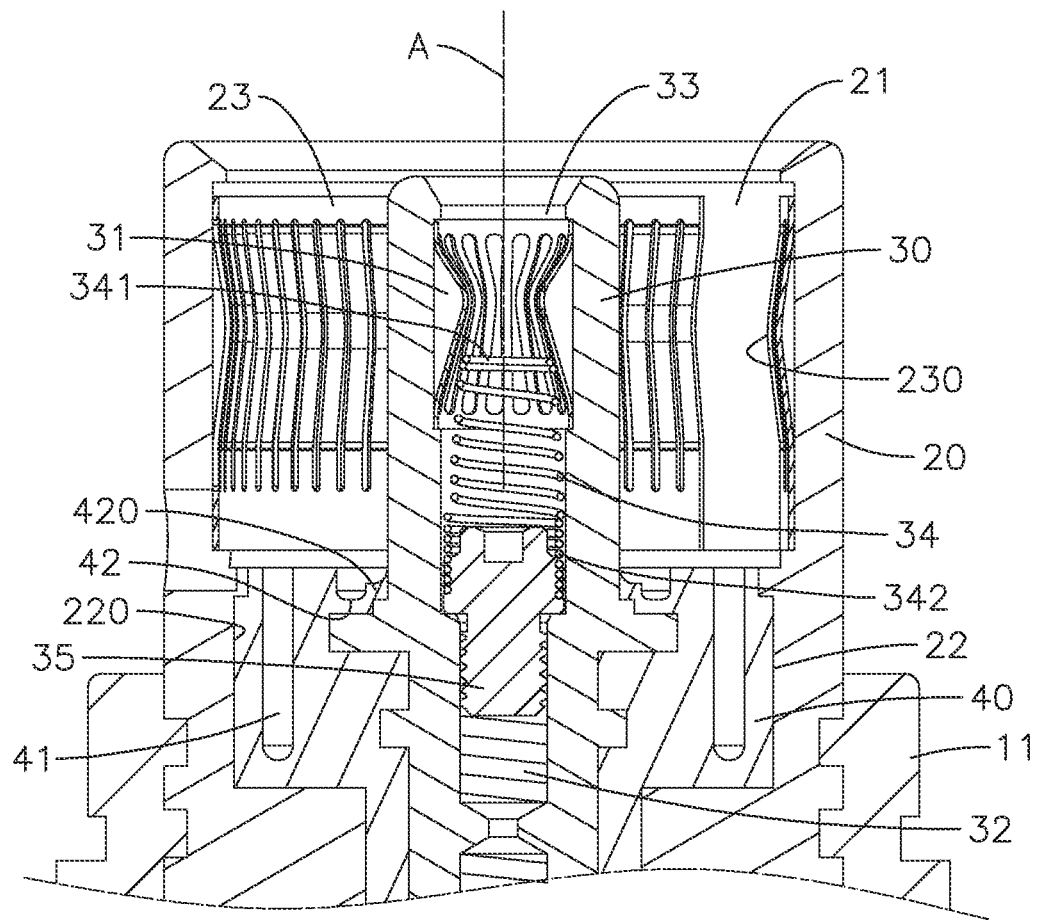
FIG. 3 is an enlarged cross sectional side view of the charging connector for the electric vehicle in FIG. 2.

An isolation member 40 is complementary in shape to the lower cavity 22 and is mounted in the lower cavity 22 of the first conductive terminal 20. The isolation member 40 is made of an insulation material and has an upper surface. The upper surface of the isolation member 40 faces a bottom of the upper cavity 21. At least one annular groove is coaxially recessed in the upper surface of the isolation member 40 and extends downwardly. With reference to FIG. 3, in the embodiment, an outer annular groove 41 and an inner annular groove 42 are formed in the upper surface of the isolation member 40. The outer annular groove 41 is located at an outer side with respect to the inner annular groove 42 and has a diameter larger than a dimeter of the inner annular groove 42 and a depth larger than a depth of the inner annular groove 42. The depth of the outer annular groove 41 is larger than half of a length of the isolation member 40. The inner annular groove 42 is closer to a center of the isolation member 40 than the outer annular groove 41. The depth of the inner annular groove 42 is smaller than the depth of the outer annular groove 41. The inner annular groove 42 has a step recess 420 radially recessed in a side thereof near the center of the isolation member 40.

The second conductive terminal 30 is mounted in the center of the isolation member 40, and is surrounded by the outer annular groove 41 and the inner annular groove 42 formed in the upper surface of the isolation member 40. One of two ends of the second conductive terminal 30 extends into the upper cavity 21 of the first conductive terminal 20. The other one of the two ends of the second conductive terminal 30 extends out from the bottom of the isolation member 40. With reference to FIG. 3 because the lower cavity 22 of the first conductive terminal 20 has the recessed surface 220 to increase the internal diameter thereof, an external diameter of the isolation member 40 is increased accordingly.

Figure 4:
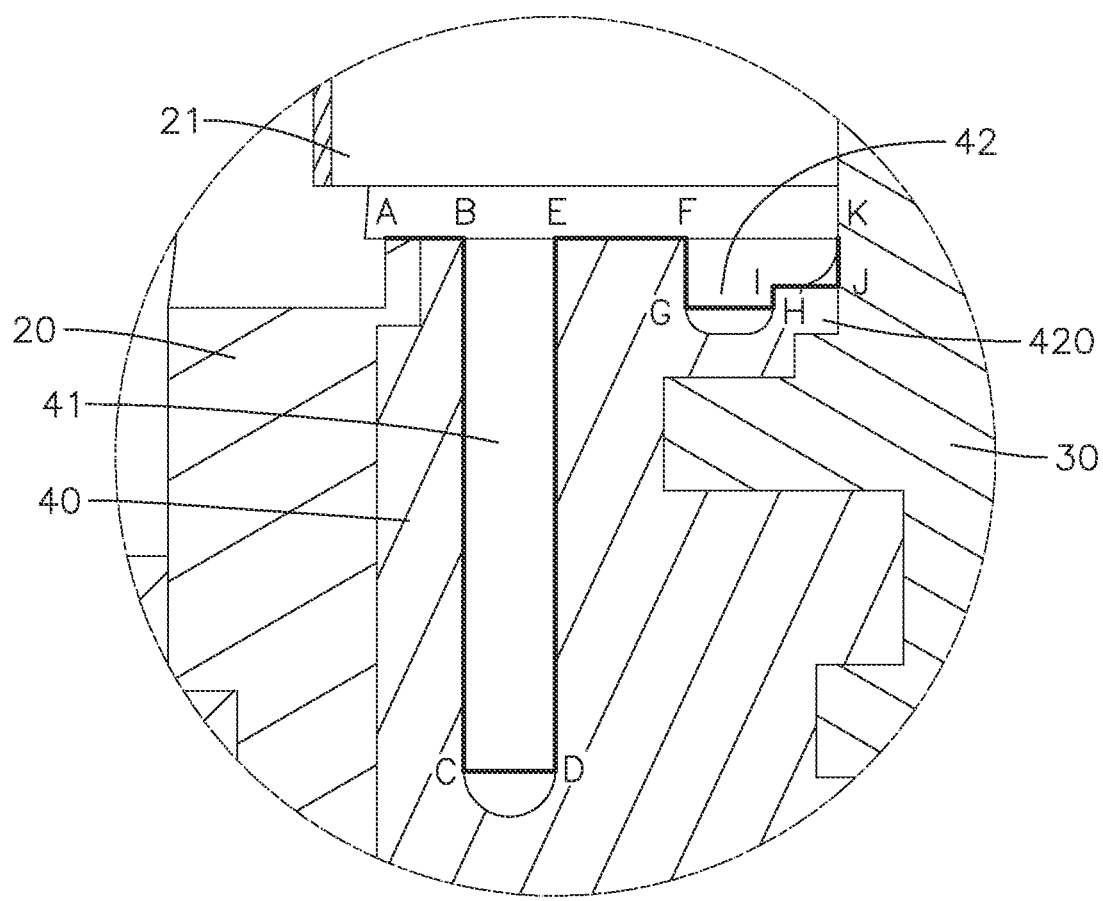
FIG. 4 is a further enlarged cross sectional side view of the charging connector for the electric vehicle in FIG. 3.

A creepage distance from the first conductive terminal 20 to the second conductive terminal 30 along a horizontal direction is increased. In addition, the creepage distance along a vertical direction is further increased by the outer annular groove 41 and the inner annular groove 42 formed in the upper surface of the isolation member 40 and extended downwardly. With reference to FIG. 4, the actual creepage distance between the first conductive terminal 20 and the second conductive terminal 30 is summation of distances ($\overline{AB}+\overline{BC}+\overline{CD}+\overline{DE}+\overline{EF}+\overline{FG}+\overline{GH}+\overline{HI}+\overline{IJ}+\overline{JK}$) in the upper surface of the isolation member 40 including multiple height differences. After measured, the actual creepage distance is 18.23 millimeters and meets the safety specifications, i.e., larger than 17.6 millimeters.

Also, because the isolation member 40 has the outer annular groove 41 and the inner annular groove 42 in the upper surface thereof to increase a surface area of the isolation member 40, the isolation member 40 has the larger surface area for heat dissipation.

With reference to FIG. 3, regarding electrical clearance, a crown spring 23 is mounted in the upper cavity 21 of the first conductive terminal 20 and conductively connected thereto. The crown spring 23 has multiple contacting reeds. Each of the contacting reeds bends toward an axial direction in the first conductive terminal 20 to form a contact point 230. The electrical clearance between the first conductive terminal 20 and the second conductive terminal 30 is a distance from each of the contact points 230 of the crown spring 23 to the second conductive terminal 30 and is larger than 2.5 millimeters as required by the safety specifications.

With reference to FIG. 2, the second conductive terminal 30 is slender, hollow, and tubular and has an upper channel 31 and a lower channel 32 formed therein and communicating with each other. A diameter of the upper channel 31 is larger than a diameter of the lower channel 32. The lower channel 32 is a threaded hole. A flexible contact member 33 and a contacting spring 34 are mounted in the upper channel 31 of the second conductive terminal 30. The contacting spring 34 is located at a lower segment of the upper channel 31. The flexible contact member 33 is a crown spring and is located at an upper segment of the upper channel 31 and above the contacting spring 34.

Figure 5:
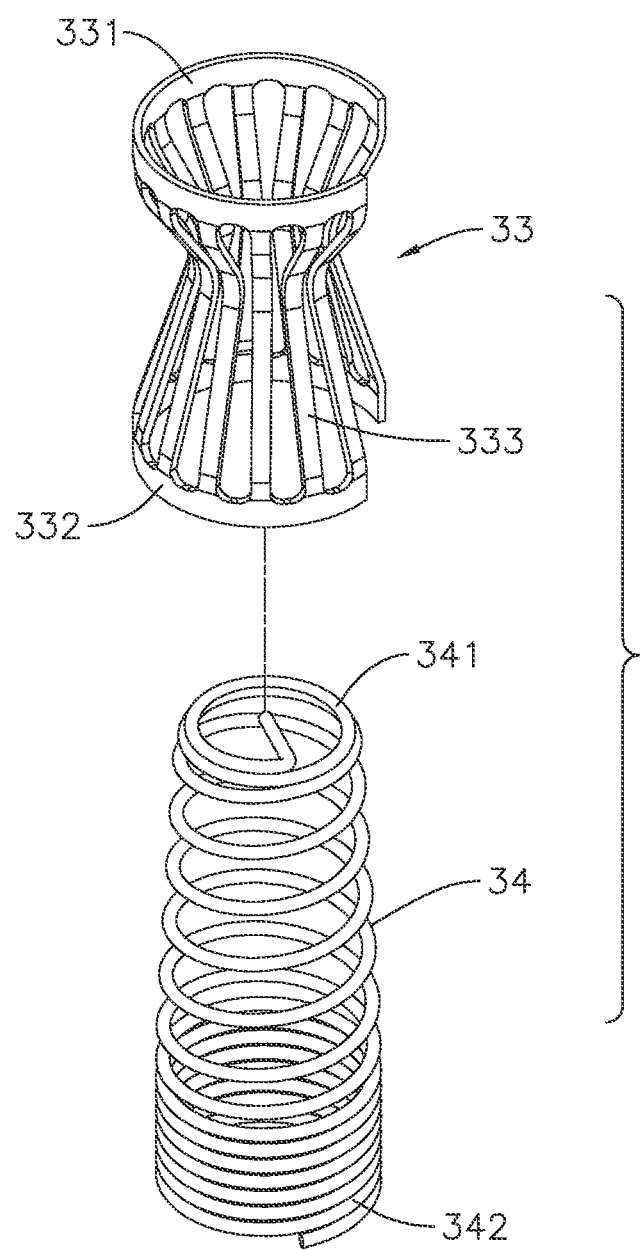
FIG. 5 is an exploded perspective view of a flexible contacting member and a contacting spring of the charging connector for the electric vehicle in FIG. 2.

With reference to FIG. 5, the flexible contact member 33 has an upper ring 331, a lower ring 332, and multiple contacting reeds 333. Two ends of each of the contacting reeds 333 are respectively connected with the upper ring 331 and the lower ring 332. With reference to FIG. 3, each of the contacting reeds 333 is bended toward an axis A in the upper ring 331 and the lower ring 332 to form a contact point. In the embodiment, a distance from the contact point of each of the contacting reeds 333 to the lower ring 332 is larger than a distance from the contact point to the upper ring 331. Compared with a conventional crown spring, lengths (moment arms) of the contacting reeds 333 of the flexible contact member 33 are increased to extend service life of the flexible contact member 33.

The contacting spring 34 has a convergent portion 341 formed on a top of the contacting spring 34. An external diameter of the convergent portion 341 is smaller than an internal diameter of the lower ring 332 of the flexible contact member 33 and is larger than an internal diameter of the flexible contact member 33 at the contact points thereof. So the convergent portion 341 is located below the contact points of the flexible contact member 33. The contacting spring 34 has a dense-turn portion 342, where a coil of the contacting spring 34 is wound closely and formed on a bottom of the contacting spring 34. With reference to FIG. 3, a threaded rod 35 extends into the dense-turn portion 342 of the contacting spring 34. The threaded rod 35 is threaded into the lower channel 32 of the second conductive terminal 30 to fix the contacting spring 34 in the upper channel 31 of the second conductive terminal 30.

Figure 6:
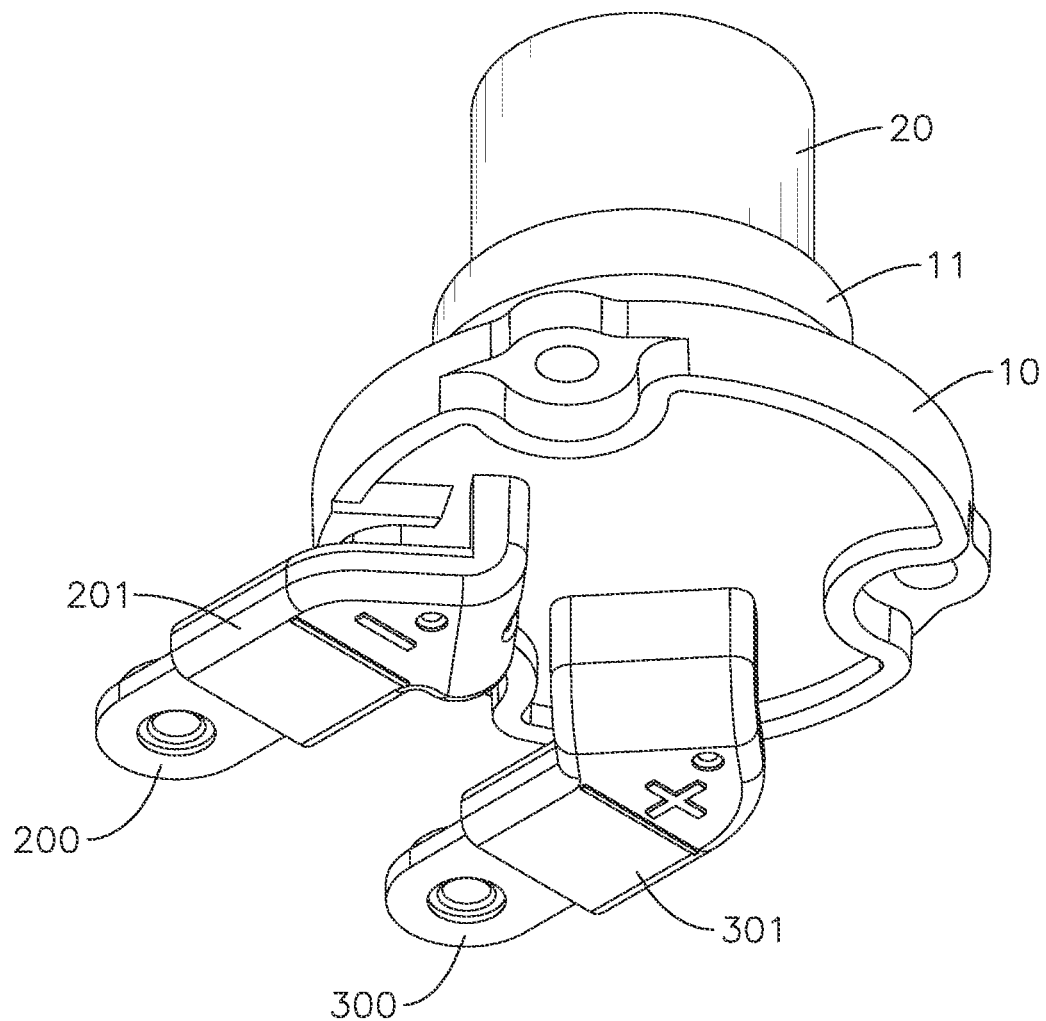
FIG. 6 is a bottom perspective view of the charging connector for the electric vehicle in FIG. 1.
Figure 7:
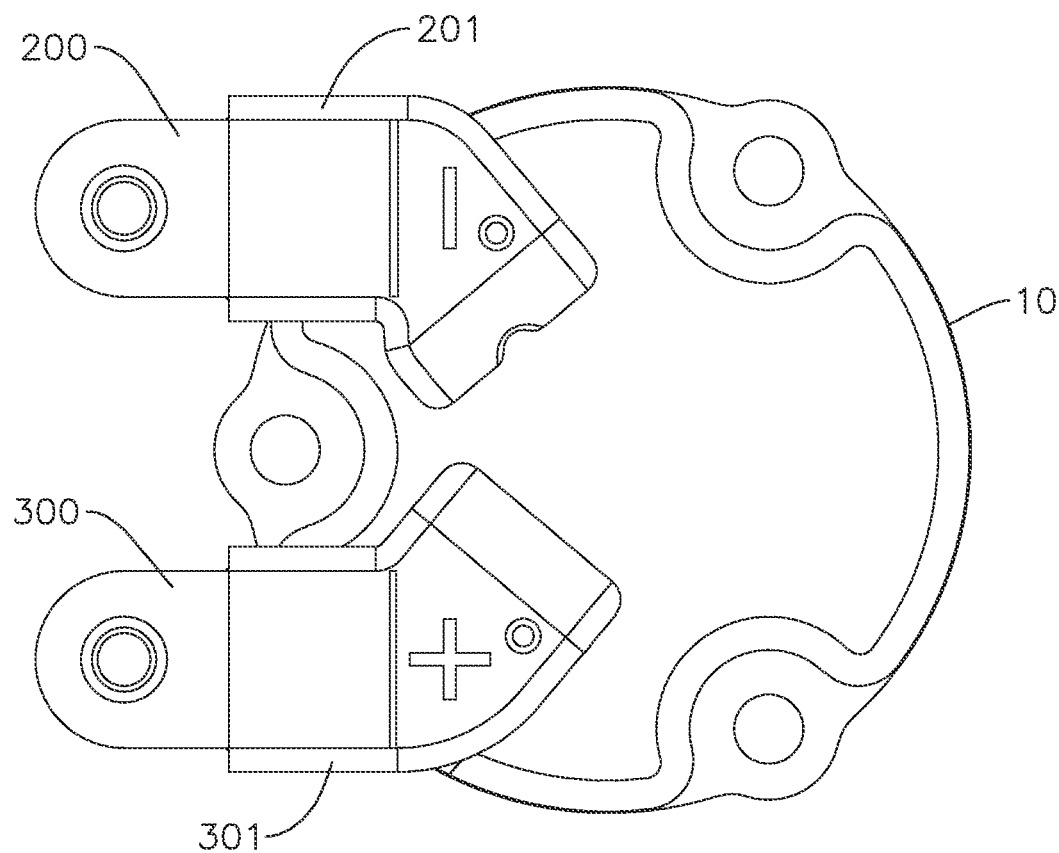
FIG. 7 is a bottom plan view of the charging connector for the electric vehicle in FIG. 1.
Figure 8:
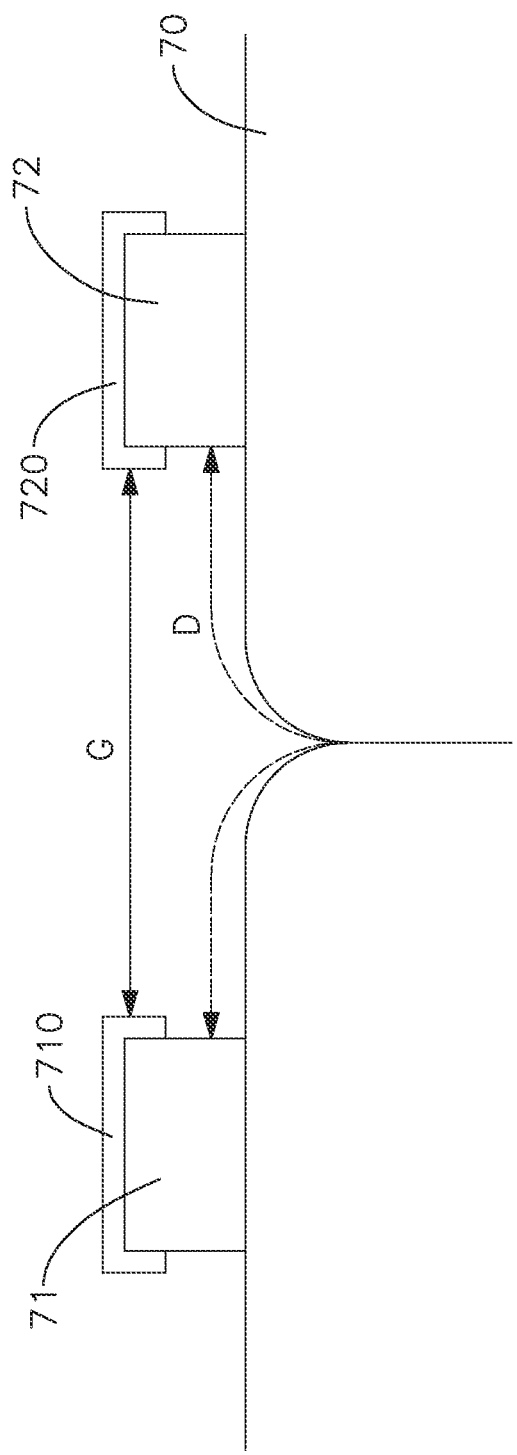
FIG. 8 is a schematic diagram showing measurement for creepage distance and electrical clearance.
Figure 9:
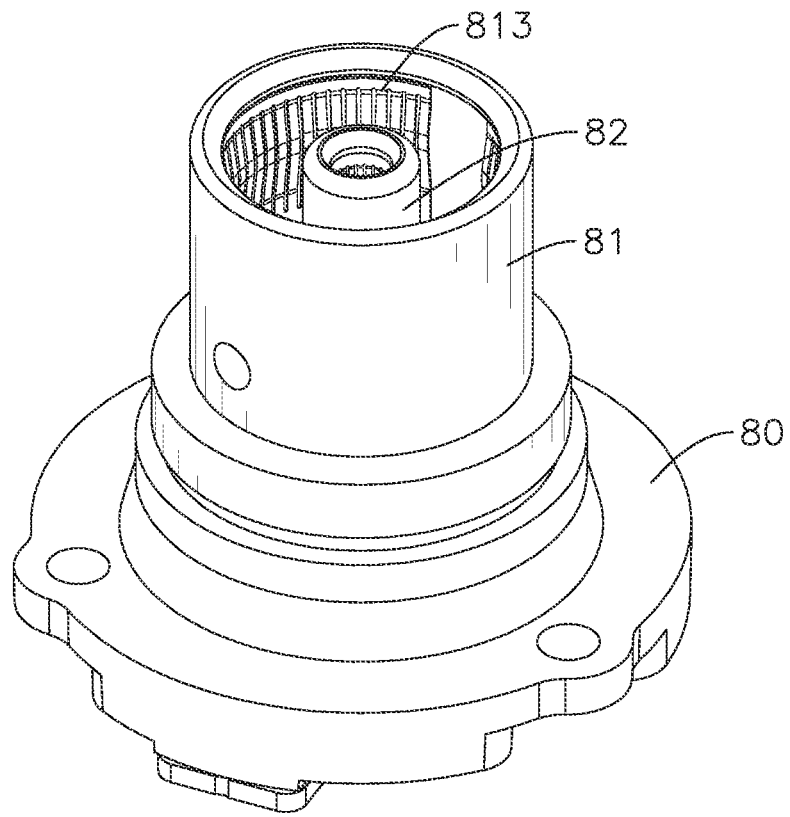
FIG. 9 is a perspective view of a connector for an electrical vehicle in accordance with a prior art.
Figure 10:
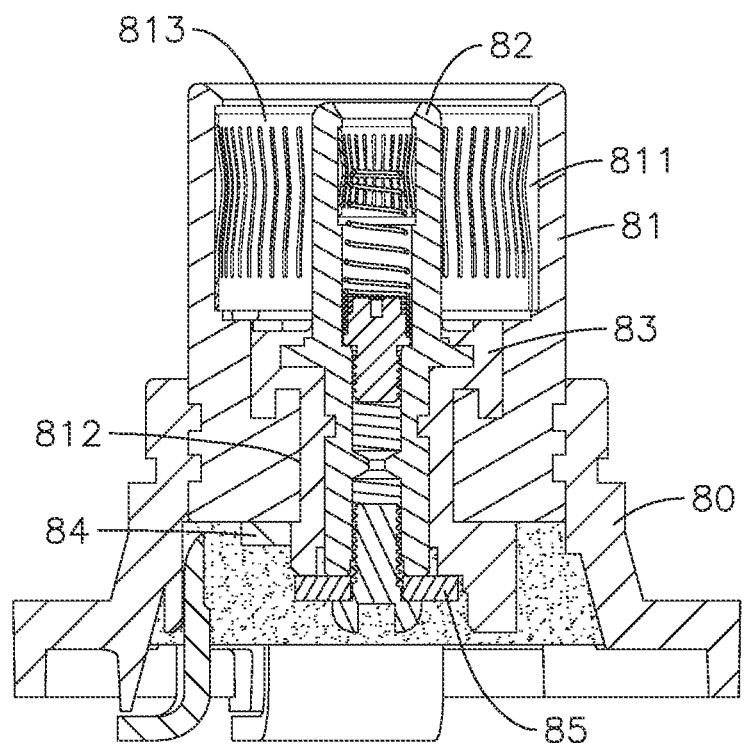
FIG. 10 is a cross sectional side view of the connector for the electrical vehicle in FIG. 9.
Figure 11:
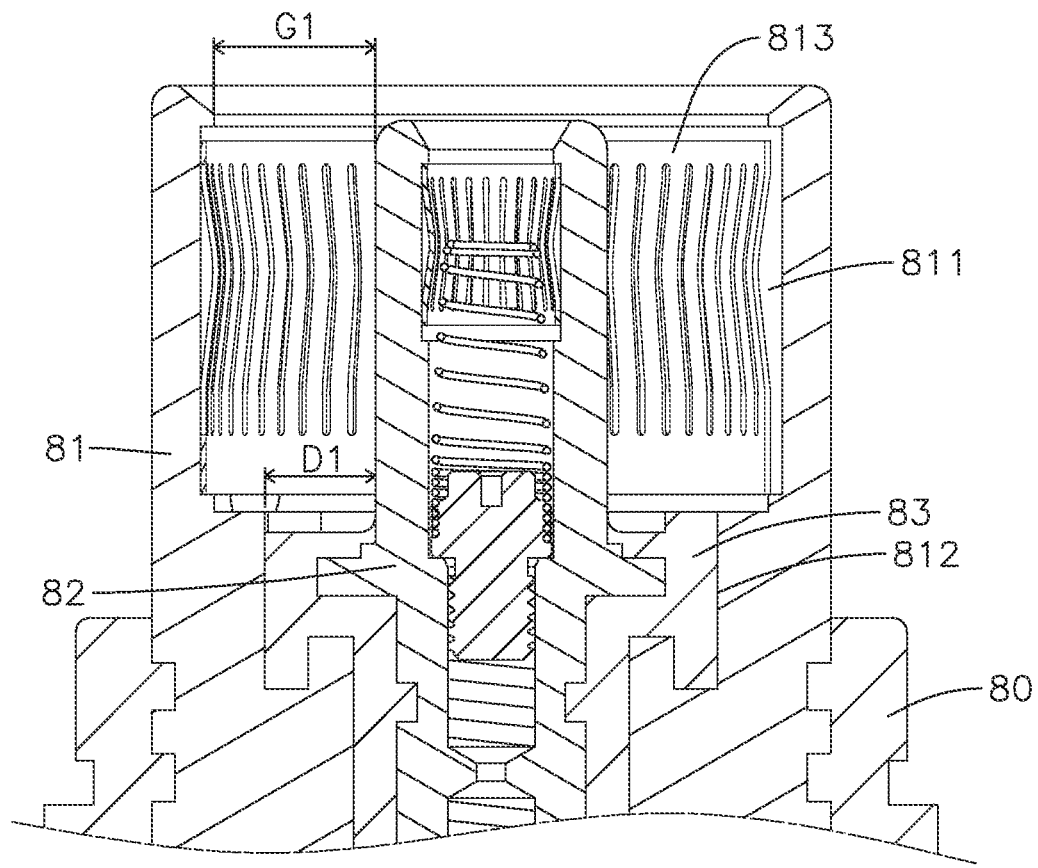
FIG. 11 is an enlarged cross sectional side view of the connector for the electrical vehicle in FIG. 10.
Figure 12:
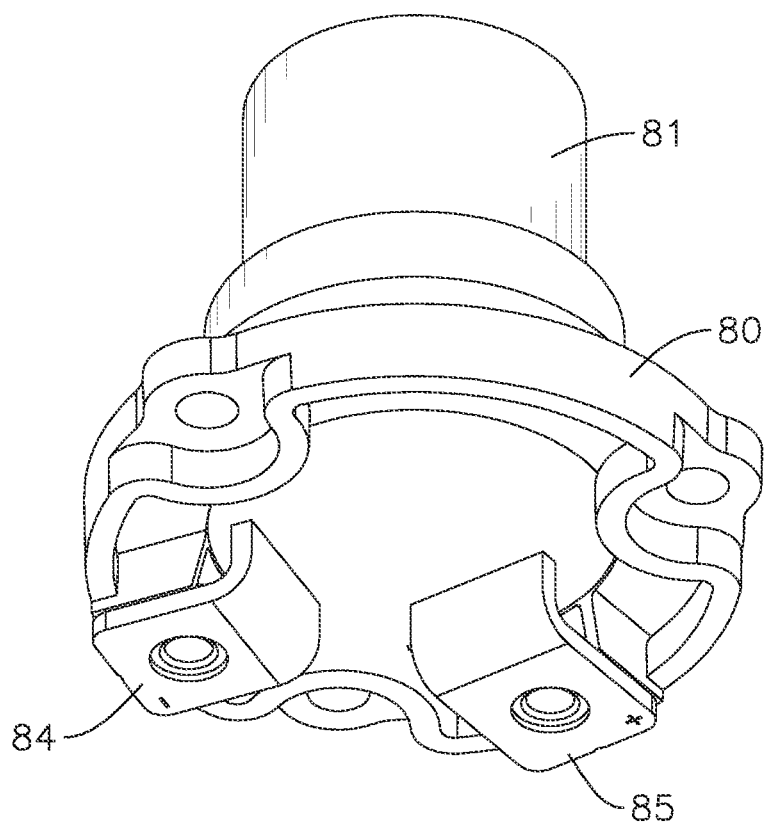
FIG. 12 is a bottom perspective view of the connector for the electrical vehicle in FIG. 9.
Figure 13:
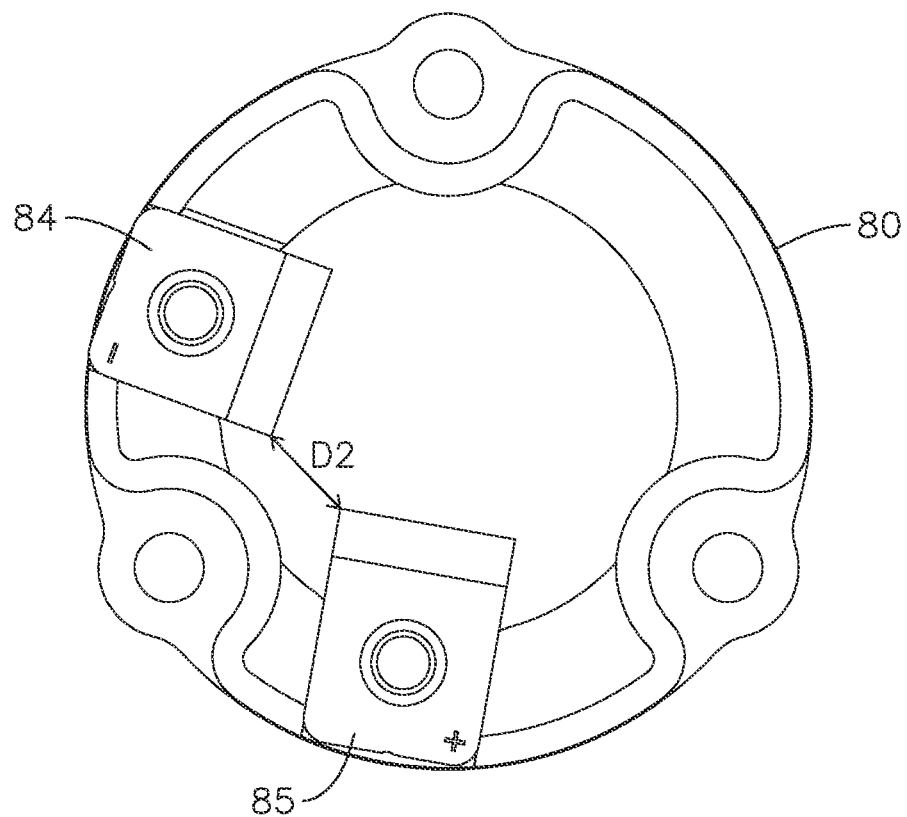
FIG. 13 is a bottom plan view of the connector for the electrical vehicle in FIG. 9.

With reference to FIGS. 1 and 6, a first connecting sheet 200 and a second connecting sheet 300 are mounted on a bottom of the connector base 10 at a same side thereof. The first connecting sheet 200 and the second connecting sheet 300 face to each other at an angle. The first connecting sheet 200 and the second connecting sheet 300 each have one respective end extending into the connector base 10, and the two ends are connected with the first conductive terminal 20 and the second conductive terminal 30 respectively. The first connecting sheet 200 and the second connecting sheet 300 vertically extend out from the bottom of the connector base 10 and are twisted to horizontally extend and to be parallel to each other (as shown in FIG. 7). A segment of each of the first connecting sheet 200 and the second connecting sheet 300 extending out from the connector base 10 is covered by an insulation layer 201, 301 except that an end of the segment is uncovered for electrical connection. The arrangements of the insulation layers 201, 301 can greatly increase a creepage distance between the first connecting sheet 200 and the second connecting sheet 300 to meet the safety specifications.

According to the embodiment, the internal diameter of the lower cavity 22 of the first conductive terminal 20 is increased to increase the external diameter of the isolation member 40. Accordingly, the creepage distance between the first conductive terminal 20 and the second conductive terminal 30 along the horizontal direction is increased. The at least one annular groove is formed in the upper surface of the isolation member 40 and further increases the creepage distance between the first conductive terminal 20 and the second conductive terminal 30 along the vertical direction. So there is enough creepage distance to meet the safety specifications. In addition, the at least one annular groove formed in the upper surface of the isolation member 40 increases the surface area thereof to increase the area of the isolation member 40 for heat dissipation. In addition, the first connecting sheet 200 and the second connecting sheet 300 for external connection are covered by the insulation layers 201, 301 at segments thereof extending out from the connector base 10, such that the creepage distance between the first connecting sheet 200 and the second connecting sheet 300 meets the safety specifications.

What is claimed is:

1. A charging connector for an electric vehicle comprising:
   a connector base;
   a first conductive terminal mounted in the connector base via one of two ends of the first conductive terminal, extending out from the connector base via the other one of the two ends of the first conductive terminal, being tubular, and having
   an upper cavity; and
   a lower cavity formed in the first conductive terminal and having a recessed surface radially recessed in a cavity surface of the lower cavity to increase an internal diameter of the lower cavity;
   an isolation member being complementary in shape to the lower cavity and mounted in the lower cavity, the isolation member having at least one annular groove coaxially recessed in an upper surface of the isolation member and extending downwardly;
   a second conductive terminal mounted in a center of the isolation member and coaxially disposed in and electrically isolated from the first conductive terminal, one of two ends of the second conductive terminal extending into the upper cavity of the first conductive terminal, and the other one of the two ends of the second conductive terminal extending out from a bottom of the isolation member;
   wherein an outer annular groove and an inner annular groove are formed in the upper surface of the isolation member, and the outer annular groove is located at an outer side with respect to the inner annular groove; and wherein a depth of the outer annular groove is larger than half of a length of the isolation member.

2. The charging connector for the electric vehicle as claimed in claim 1, wherein the second conductive terminal is tubular and has an upper channel and a lower channel formed in the second conductive terminal and communicating with each other, a diameter of the upper channel is larger than a diameter of the lower channel;

a flexible contact member and a contacting spring are mounted in the upper channel of the second conductive terminal;

the contacting spring is located at a lower segment of the upper channel; and the flexible contact member is located at an upper segment of the upper channel and above the contacting spring.

3. The charging connector for the electric vehicle as claimed in claim 2, wherein the flexible contact member has an upper ring, a lower ring, and multiple contacting reeds;

two ends of each of the contacting reeds are respectively connected with the upper ring and the lower ring;

each of the contacting reeds of the flexible contact member is bended toward an axis in the upper ring and the lower ring to form a contact point; and a distance from the contact point of each of the contacting reeds of the flexible contact member to the lower ring is larger than a distance from the contact point to the upper ring.

4. The charging connector for the electric vehicle as claimed in claim 3, wherein the contacting spring has a convergent portion formed on a top of the contacting spring; and an external diameter of the convergent portion is smaller than an internal diameter of the lower ring of the flexible contact member and larger than an internal diameter of the flexible contact member at the contact points of the flexible contact member.

5. The charging connector for the electric vehicle as claimed in claim 4, wherein the lower channel of the second conductive terminal is a threaded hole;

the contacting spring has a dense-turn portion, where a coil of the contacting spring is wound closely and formed on a bottom of the contacting spring; and a threaded rod extends into the dense-turn portion of the contacting spring and is threaded into the lower channel of the second conductive terminal.

6. The charging connector for the electric vehicle as claimed in claim 1, wherein a first connecting sheet and a second connecting sheet are mounted on a bottom of the connector base at a same side of the connector base and face to each other at an angle;

the first connecting sheet and the second connecting sheet each have one respective end extending into the connector base and connected with the first conductive terminal and the second conductive terminal respectively; and a segment of each of the first connecting sheet and the second connecting sheet extending out from the connector base is covered by an insulation layer, except that an end of the segment is uncovered for electrical connection.

7. The charging connector for the electric vehicle as claimed in claim 6, wherein the first connecting sheet and the second connecting sheet vertically extend out from the bottom of the connector base and are twisted to horizontally extend and to be parallel to each other.

8. A charging connector for an electric vehicle comprising:

a connector base;

a first conductive terminal mounted in the connector base via one of two ends of the first conductive terminal, extending out from the connector base via the other one of the two ends of the first conductive terminal, being tubular, and having an upper cavity; and a lower cavity formed in the first conductive terminal and having a recessed surface radially recessed in a cavity surface of the lower cavity to increase an internal diameter of the lower cavity;

an isolation member being complementary in shape to the lower cavity and mounted in the lower cavity, the isolation member having at least one annular groove coaxially recessed in an upper surface of the isolation member and extending downwardly;

a second conductive terminal mounted in a center of the isolation member and coaxially disposed in and electrically isolated from the first conductive terminal, one of two ends of the second conductive terminal extending into the upper cavity of the first conductive terminal, and the other one of the two ends of the second conductive terminal extending out from a bottom of the isolation member;

wherein an outer annular groove and an inner annular groove are formed in the upper surface of the isolation member, and the outer annular groove is located at an outer side with respect to the inner annular groove; and wherein a depth of the inner annular groove is smaller than a depth of the outer annular groove, and the inner annular groove has a step recess recessed in a side of the inner annular groove near the center of the isolation member.

\* \* \* \* \*